US012660205B2

(12) United States Patent
Hwang et al.

(10) Patent No.: US 12,660,205 B2
(45) Date of Patent: Jun. 16, 2026

(54) TEMPORAL KERNEL DEVICES, TEMPORAL KERNEL COMPUTING SYSTEMS, AND METHODS OF THEIR OPERATION

(71) Applicant: SEOUL NATIONAL UNIVERSITY R&DB FOUNDATION, Seoul (KR)

(72) Inventors: Cheol Seong Hwang, Seoul (KR); Yoon Ho Jang, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 916 days.

(21) Appl. No.: 17/911,043

(22) PCT Filed: May 19, 2022

(86) PCT No.: PCT/KR2022/007161
§ 371 (c)(1),
(2) Date: Sep. 12, 2022

(87) PCT Pub. No.: WO2023/080370
PCT Pub. Date: May 11, 2023

(65) Prior Publication Data
US 2024/0215265 A1     Jun. 27, 2024

(30) Foreign Application Priority Data

Nov. 4, 2021     (KR) ........................ 10-2021-0150604

(51) Int. Cl.
H10B 63/00     (2023.01)
G06N 20/10     (2019.01)
G11C 13/00     (2006.01)

(52) U.S. Cl.
CPC ............. H10B 63/80 (2023.02); G06N 20/10 (2019.01); G11C 13/004 (2013.01);
(Continued)

(58) Field of Classification Search
CPC ...... H10B 63/80; G06N 20/10; G11C 13/004; G11C 13/0069; G11C 2013/0045;
(Continued)

(56) References Cited

U.S. PATENT DOCUMENTS 10,855,288 B2 * 12/2020 Kvatinsky .............. H03K 19/20
2020/0342299 A1 * 10/2020 Yi ......................... H10F 39/107
(Continued)

FOREIGN PATENT DOCUMENTS

| CN | 111553415 | 8/2020 |
| KR | 10-2017-0109234 | 9/2017 |
| KR | 10-2021-0090082 | 7/2021 |

OTHER PUBLICATIONS

Jang, Y.H., Kim, W., Kim, J et al. Time-varying data processing with nonvolatile memristor-based temporal kernel. Nat Commun 12, 5727 (2021). https://doi.org/10.1038/s41467-021-25925-5 (Year: 2021).*
(Continued)

*Primary Examiner* — Jeremy L Stanley

(57)     ABSTRACT
The present disclosure relates to a temporal kernel device including at least one temporal kernel cell structure, wherein each of the temporal kernel cell structure including a nonvolatile memristor; and a resistor and a capacitor connected in parallel to each other, and the resistor and the capacitor connected in parallel are connected in series to the nonvolatile memristor.

13 Claims, 7 Drawing Sheets

(52) U.S. Cl.
    CPC .. *G11C 13/0069* (2013.01); *G11C 2013/0045*
        (2013.01); *G11C 2013/0052* (2013.01); *G11C*
            *2013/0092* (2013.01); *G11C 2213/15*
        (2013.01); *G11C 2213/32* (2013.01); *G11C*
                            *2213/52* (2013.01)

(58) Field of Classification Search
    CPC .... G11C 2013/0052; G11C 2013/0092; G11C
            2213/15; G11C 2213/32; G11C 2213/52
    See application file for complete search history.

(56) References Cited

U.S. PATENT DOCUMENTS

| | | | |
|---|---|---|---|
| 2020/0342301 | A1* | 10/2020 | Miao .................... G06N 3/084 |
| 2020/0356847 | A1* | 11/2020 | Yi .......................... G06F 17/15 |
| 2021/0143834 | A1* | 5/2021 | Kvatinsky ........... H03M 1/1033 |
| 2022/0261621 | A1* | 8/2022 | Liu ..................... H10N 70/883 |

OTHER PUBLICATIONS

International Search Report mailed Aug. 26, 2022 for PCT/KR2022/007161.

Yoon Ho Jang et al., Time-varying data processing with nonvolatile memristor-based temporal kernel, Nature Communications, (2021) 12:5727.

Yesheng Li et al., Hardware Implementation of Neuromorphic Computing Using Large-Scale Memristor Crossbar Arrays, Advanced Intelligent System, 2021, 3, 2000137.

Office Action dated Apr. 28, 2023 corresponding to Korean Patent Application No. 10-2021-0150604, 7 pages.

Alexander Dozortsev et al., "Analysis of the row grounding technique in a memristor-based crossbar array", Int. J. Cirx. Theor. Appl., 2018, 46:122-137.

Jiadi Zhu et al., "A comprehensive review on emerging artificial neuromorphic devices", Appl. Phys. Rev. 7, 011312 (2020).

* cited by examiner

\<Comparative example\>

TEMPORAL KERNEL DEVICES, TEMPORAL KERNEL COMPUTING SYSTEMS, AND METHODS OF THEIR OPERATION

This application claims the priority of Korean Patent Application No. 10-2021-0150604, filed on Nov. 4, 2021 in the KIPO (Korean Intellectual Property Office), the disclosure of which is incorporated herein entirely by reference. Further, this application is the National Stage application of International Application No. PCT/KR2022/007161, filed on May 19, 2022, which designates the United States and was published in Korean. Each of these applications is hereby incorporated by reference in their entirety into the present application.

TECHNICAL FIELD

The present invention relates to a kernel-related apparatus and system, and more particularly, to a temporal kernel device, a temporal kernel computing system including the same, and operating methods thereof.

BACKGROUND ART

In computer science, the kernel is one of the computer programs that is the core of the computer operating system, and plays a role in controlling the system as a whole and providing various services necessary for the execution of application programs. In the field of artificial intelligence, which has recently been attracting attention, the kernel may perform a process for pre-processing a signal input to an artificial neural network. In particular, the temporal kernel refers to a kernel capable of processing data in time-series.

As a device for a conventional temporal kernel, there is a reservoir computing device. The reservoir computing device includes one volatile memristor in a unit cell structure, and is configured to process an input signal according to time by using the volatile characteristic of the memristor. However, the conventional volatile memristor-based temporal kernel device has limitations in that the frequency of a signal to be processed is fixed and the kernel characteristic cannot be changed. In addition, in connection with the temporal kernel based on the volatile memristor, since relaxation of the conductance state of the memristor is based on material properties, there are limitations that the speed may not be controlled and other dynamics other than relaxation may not be implemented. Therefore, the conventional temporal kernel device has a problem in that the application field of the technology is limited, and the accuracy and processing speed of signal processing are deteriorated.

DISCLOSURE OF THE INVENTION

Technical Problem

Unlike the existing volatile memristor-based reservoir devices that may implement only a single characteristic, a technological object of the present invention is to provide a temporal kernel device, of which the time constant may be adjusted freely and various characteristics may be implemented so that it may be applied to a wide field, and may be optimized according to the task.

In addition, a technological object of the present invention is to provide a temporal kernel device capable of improving accuracy, efficiency, and processing speed of a signal processing, and capable of processing a signal in a wide frequency range.

Furthermore, another object of the present invention is to provide a temporal kernel computing system including the temporal kernel device as described in above paragraphs.

Furthermore, another object of the present invention is to provide methods of operating the temporal kernel device and the temporal kernel computing system.

The problems to be solved by the present invention are not limited to the problems mentioned above, and other problems not mentioned will be understood by those skilled in the art from the following description.

Technical Solution

According to an embodiment of the present invention, a temporal kernel device includes at least one temporal kernel cell structure, wherein each of the temporal kernel cell structure includes a nonvolatile memristor; and a resistor and a capacitor connected in parallel to each other, and the resistor and the capacitor connected in parallel are connected in series to the nonvolatile memristor.

The temporal kernel device may include a first electrode, an intermediate electrode, and a second electrode, wherein the resistor and the capacitor may be disposed to be spaced apart from each other between the first electrode and the intermediate electrode, and the nonvolatile memristor may be disposed between the intermediate electrode and the second electrode.

A plurality of the temporal kernel cell structures may be arranged to form an array. The temporal kernel device may include at least one first electrode extending in a first direction, a plurality of second electrodes spaced apart from the first electrode and extending in a second direction crossing the first electrode, and a plurality of intermediate electrodes each of which is disposed between the first electrode and the plurality of second electrodes at an intersection of the first electrode and the plurality of second electrodes. The plurality of temporal kernel cell structures may be disposed at the intersections of the first electrode and the plurality of second electrodes, respectively. Each of the temporal kernel cell structures may include the resistor and the capacitor which are disposed to be spaced apart from each other between the first electrode and the intermediate electrode, and the nonvolatile memristor disposed between the intermediate electrode and the second electrode.

The at least one first electrode may be a ground electrode, and an electrical signal may be applied to the plurality of second electrodes.

The temporal kernel device may be configured to vary at least one of a resistance value of the resistor and a capacitance of the capacitor.

The resistor may be a variable resistance resistor capable of changing a resistance value.

The capacitor may be a variable capacitance capacitor capable of changing capacitance.

The temporal kernel device may be configured to process a signal corresponding to a frequency region ranging from about 1 Hz to 10 MHz.

The temporal kernel device may be configured to store information in the nonvolatile memristor and to input the information stored in the nonvolatile memristor to an artificial neural network.

According to another embodiment of the present invention, a temporal kernel computing system including the above-described temporal kernel device; and an artificial neural network connected to the temporal kernel device and receiving information processed by the temporal kernel device is provided.

According to another embodiment of the present invention, a method of operating a temporal kernel device including at least one temporal kernel cell structure, and wherein each of the temporal kernel cell structure includes a nonvolatile memristor; and a resistor and a capacitor connected in a parallel to each other, and wherein the resistor and the capacitor connected in a parallel are connected in series to the nonvolatile memristor is disclosed. The method of operating a temporal kernel device includes storing information in the nonvolatile memristor by applying a time-series input signal to the kernel cell structure; and reading the information stored in the nonvolatile memristor.

The temporal kernel device may include a first electrode, an intermediate electrode, and a second electrode, wherein the resistor and the capacitor may be disposed to be spaced apart from each other between the first electrode and the intermediate electrode, and the nonvolatile memristor may be disposed between the intermediate electrode and the second electrode.

The storing the information in the nonvolatile memristor may include applying an electrical signal corresponding to the time-series input signal to the second electrode while the first electrode is grounded.

The reading the information stored in the nonvolatile memristor may include applying an electrical signal for reading the information between the intermediate electrode and the second electrode.

The method of operating the temporal kernel device may further include changing at least one of a resistance value of the resistor and a capacitance of the capacitor.

Advantageous Effects

According to embodiments of the present invention, unlike the existing volatile memristor-based reservoir devices that may implement only a single characteristic, it is possible to implement a temporal kernel device which has a structure in which a nonvolatile memristor, and a resistor and a capacitor connected in parallel with each other are connected in series with each other, and may be applied to a wide field and may be optimized according to the work performed because it is possible to freely adjust the time constant and to implement various characteristics including the kernel characteristics based on the above structure. In addition, according to embodiments of the present invention, it is possible to implement a temporal kernel device capable of improving accuracy, efficiency, and a processing speed of signal processing, and capable of processing a signal in a wide frequency range.

In the temporal kernel device according to the embodiments of the present invention, there are various kinds of effects and advantages which may be obtained due to the spike signal generation in the nonvolatile memristor, the voltage distribution characteristic between the nonvolatile memristor and the resistor, and the asymmetric characteristic of charging/discharging, etc. In this regard, the temporal kernel device according to the embodiments may perform signal processing at a speed of about 1000 to 10000 times faster than that of the existing technology, and an energy efficiency of about 100 times or more compared to the existing technology. In addition, the temporal kernel device according to the embodiments may process a signal corresponding to a wide frequency region ranging from, for example, about 1 Hz to 10 MHz by adjusting a resistance value of a resistor and/or a capacitance of a capacitor. Furthermore, the temporal kernel device according to the embodiments may have high accuracy in a signal processing.

It is possible to implement a temporal kernel computing system applicable to various fields while having excellent performance by applying the temporal kernel device according to the above embodiments.

BRIEF DESCRIPTION OF THE DRAWINGS

FIG. 4 is a circuit diagram illustrating a second step for reading information recorded in a nonvolatile memristor in the measurement circuit described in FIG. 3.

FIG. 5 is a graph showing a form of a voltage applied to a nonvolatile memristor and a form of a voltage applied to a second channel by a predetermined pulse signal in the first step of FIG. 3.

FIG. 7 is a conceptual diagram illustrating a process for making a medical diagnosis on ultrasound data by using a temporal kernel computing system according to an embodiment of the present invention.

BEST MODE FOR CARRYING OUT THE INVENTION

Hereinafter, the embodiments of the present invention will be described in detail with reference to the accompanying drawings.

The embodiments of the present invention to be described below are provided to more clearly explain the present invention to those of ordinary skill in the related art, and the scope of the present invention is not limited by the following embodiments, and the following embodiments may be modified in many different forms.

The terminology used herein is used to describe the specific embodiments, and is not used to limit the present invention. As used herein, terms in the singular form may include the plural form unless the context clearly dictates otherwise. Also, as used herein, the terms "comprise" and/or "comprising" specifies presence of the stated shape, step, number, action, member, element and/or group thereof; and does not exclude presence or addition of one or more other shapes, steps, numbers, actions, members, elements, and/or groups thereof. In addition, the term "connection" as used herein is a concept that includes not only that certain members are directly connected, but also a concept that other members are further interposed between the members to be indirectly connected.

In addition, in the present specification, when a member is said to be located "on" another member, this includes not only a case in which a member is in contact with another member but also a case in which another member is present between the two members. As used herein, the term "and/or" includes any one and any combination of one or more of those listed items. In addition, as used herein, terms such as "about", "substantially", etc. are used as a range of the numerical value or degree, in consideration of inherent fabricating and material tolerances, or as a meaning close to the range. Furthermore, accurate or absolute numbers provided to aid the understanding of the present application are used to prevent an infringer from using the disclosed present invention unfairly.

The embodiments of the present invention will be explained in detail by referring to the attached drawings. The size or the thickness of the areas or the parts illustrated in the attached drawing may be somewhat exaggerated for clarity of the specification and convenience of description. The same reference number indicates the same configuring element throughout the detailed description.

Figure 1:
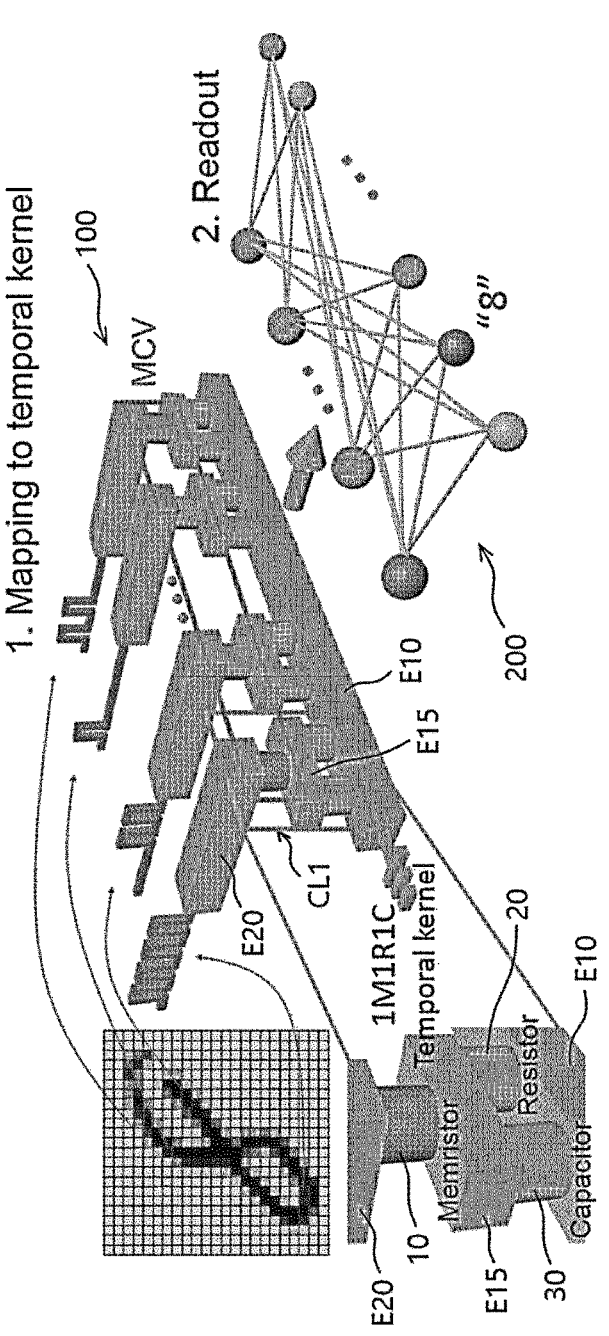
FIG. 1 is a diagram illustrating a temporal kernel device and a temporal kernel computing system including the same according to an embodiment of the present invention.

FIG. 1 is a diagram which illustrates a temporal kernel device and a temporal kernel computing system including the same according to an embodiment of the present invention. The temporal kernel device may be said to be a device for the hardware temporal kernel.

Referring to FIG. 1, the temporal kernel element 100 according to an embodiment of the present invention may include at least one or more temporal kernel cell structure CL1. The temporal kernel cell structure CL1 may include a nonvolatile memristor 10, and a register 20 and a capacitor 30 connected in parallel with each other, wherein the register 20 and the capacitor 30 connected in parallel with each other may be connected in series to the nonvolatile memristor 10. It may be mentioned that the temporal kernel cell structure CL1 has a 1M1R1C configuration, where M represents the nonvolatile memristor 10, R represents the register 20, and C represents the capacitor 30.

The nonvolatile memristor 10 may include two electrodes (e.g., a lower electrode and an upper electrode) and a resistance change material layer (a resistance change memory layer) disposed therebetween. For example, the nonvolatile memristor 10 may have a W/HfO2/TiN structure, where W (tungsten) may correspond to the lower electrode (or the upper electrode), TiN to the upper electrode (or the lower electrode), and HfO2 to the resistive change material layer, respectively. However, this is only an example, and the specific structure and the constituent material of the nonvolatile memristor 10 may be varied. The structure and the materials of the existing nonvolatile memristor may be applied to the nonvolatile memristor 10.

The register 20 is illustrated as a resistor element (a resistance device), but in some cases may include a plurality of resistor elements. In other words, it may be understood that the register 20 includes one resistor element or a plurality of resistor elements. In a case that the register 20 includes a plurality of register elements, at least one among the plurality of register elements may be selectively used.

The capacitor 30 is illustrated as a capacitor element (a capacitor device), but in some cases may include a plurality of capacitor elements. That is, it may be understood that the capacitor 30 includes one capacitor element or a plurality of capacitor elements. In a case that the capacitor 30 includes a plurality of capacitor elements, at least one among the plurality of capacitor elements may be selectively used.

The temporal kernel element 100 may include a first electrode E10, an intermediate electrode E15, and a second electrode E20. The register 20 and the capacitor 30 may be spaced apart from each other between the first electrode E10 and the intermediate electrode E15. The nonvolatile memristor 10 may be disposed between the intermediate electrode E15 and the second electrode E20. Accordingly, the nonvolatile memristor 10 and the resistor 20 may be connected in series through the intermediate electrode E15, and similarly, the nonvolatile memristor 10 and the capacitor 30 may be connected in series through the intermediate electrode E15. Also, the resistor 20 and the capacitor 30 may be connected in parallel to the nonvolatile memristor 10 through the intermediate electrode E15. The temporal kernel cell structure CL1 may be considered to include the nonvolatile memristor 10, the resistor 20, the capacitor 30, and the intermediate electrode E15, and it may also be considered that the first electrode E10 and the second electrode E20 are connected to one end and the other end of the temporal kernel cell structure CL1, respectively. In some cases, at least a portion of the first electrode E10 and/or at least a portion of the second electrode E20 may also be considered to be included in the temporal kernel cell structure CL1.

A plurality of temporal kernel cell structures CL1 may be arranged. In other words, a plurality of temporal kernel cell structures CL1 may be arranged to form an array. At this time, the temporal kernel device 100 may include at least one first electrode E10 extending in the first direction, a plurality of second electrodes E20 which are extending in a second direction, and is spaced apart from the first electrode E10 (e.g., spaced apart in the upward direction) and are intersecting (e.g., perpendicularly crossing) the first electrode E10, and a plurality of intermediate electrodes E15 which are disposed between the first electrode E10 and the plurality of second electrodes E20 at each of the intersections of the first electrode E10 and the plurality of second electrodes E20. The plurality of temporal kernel cell structures CL1 may be disposed at each of the intersections of the first electrode E10 and the plurality of second electrodes E20, respectively. Accordingly, a plurality of temporal kernel cell structures CL1 spaced apart from each other in a direction parallel to the first electrode E10 may be disposed on the first electrode E10, and the second electrode E20 connected (contacted) to each of the temporal kernel cell structure CL1 may be disposed on each of the temporal kernel cell structure CL1. Each of the temporal kernel cell structures CL1 may include the resistor 20 and the capacitor 30 disposed to be spaced apart from each other between the first electrode E10 and the intermediate electrode E15, and the nonvolatile memristor 10 disposed between the intermediate electrode E15 and the second electrode E20. Here, a case in which one first electrode E10 is used is illustrated, but a plurality of first electrodes E10 may be disposed to be spaced apart from each other, and a plurality of temporal kernel cell structures CL1 and a plurality of second electrodes E20 may be disposed on each of the first electrodes E10. Also, the device stack from the first electrode E10 to the second electrode E20 may be upside down.

The first electrode E10 may be a ground electrode, and the second electrode E20 may be an electrode to which an electrical signal corresponding to a time-series input signal (e.g., an input signal which changes with time) is applied. In the step for storing information in the temporal kernel device 100, the electrical signal may be applied to the plurality of second electrodes E20 while the first electrode E10 is grounded. Through this process, information may be stored in the nonvolatile memristors 10 of each of the plurality of temporal kernel cell structures CL1. Meanwhile, in the step for reading information stored in the nonvolatile memristor 10, an electrical signal for reading the information may be applied between the intermediate electrode E15 and the second electrode E20. The electrical signal for reading the information may be, for example, a direct current (DC) voltage signal, and the information may be read by measuring (sensing) the magnitude of the current flowing through the nonvolatile memristor 10 due to application of the direct current (DC) voltage signal.

The temporal kernel device 100 according to the embodiment of the present invention may have the temporal kernel cell structure CL1 including the above-described 1M1R1C configuration, and in connection with the temporal kernel cell structure CL1, a spike (a voltage spike) signal generation in the nonvolatile memristor 10, a voltage distribution characteristics between the nonvolatile memristor 10 and the resistor 20, asymmetric characteristics of charging/discharging, etc. may appear, and thus, various effects/advantages may be obtained. According to the number or height of the spikes in the nonvolatile memristor 10 and/or according to the degree or rate of discharging in the capacitor 30, the information stored in the nonvolatile memristor 10, that is, the resistance state (a resistance value) of the nonvolatile memristor 10 may vary. In addition, the characteristics of the input signal applied to the volatile memristor 10 may be changed due to the influence of voltage distribution between the nonvolatile memristor 10 and the resistor 20 by the series connection of the nonvolatile memristor 10 and the resistor 20, the RC delay caused by the resistor 20 and the capacitor 30, and the like. Therefore, the changes are may be applied to the volatile memristor 10, and its resistance state may be changed according to a signal (a voltage signal) applied to the nonvolatile memristor 10. The above-described spike signal generation, a voltage distribution characteristic, asymmetry of charging and discharging, and the effects thereof will be described later in more detail.

In addition, the temporal kernel device 100 according to an embodiment of the present invention may be configured to vary at least one of a resistance value of the resistor 20 and a capacitance of the capacitor 30.

The resistor 20 may be a 'variable resistance resistor' capable of changing a resistance value. In this case, the resistor 20 may include one variable resistor element or a plurality of resistor elements having different resistance values. In the latter case, the resistance value may be selected by selecting and using at least one of the plurality of resistor elements. Alternatively, the resistance value may be selected by manufacturing a plurality of transistors and selectively opening a channel of at least one of the plurality of transistors. In this case, the resistor 20 may be configured to include the plurality of transistors. In addition, the variable resistance resistor may be configured in various ways.

The capacitor 30 may be a 'variable capacitance capacitor' capable of changing capacitance. In this case, the capacitor 30 may include one variable capacitance capacitor element or a plurality of capacitor elements having different capacitances. The variable capacitance capacitor element may be, for example, a capacitor having a metal-insulator-semiconductor (MIS) structure. When using the plurality of capacitor elements, the capacitance may be selected by selecting and using at least one of them.

The temporal kernel device 100 according to an embodiment of the present invention greatly widens the bandwidth (a frequency band) of a signal which may be processed by adjusting the resistance value of the resistor 20 and/or the capacitance of the capacitor 30. In addition, it is possible to optimize the characteristics of the temporal kernel device 100 according to the field of use. Accordingly, the temporal kernel device 100 according to the embodiment may process a signal corresponding to a wide frequency region ranging from, for example, about 1 Hz to 10 MHz. In addition, the temporal kernel device 100 according to the embodiment may be used in various fields with optimized characteristics suitable for the field.

The temporal kernel device 100 according to an embodiment of the present invention may be configured to process a time-series input signal (input information) to store information in the nonvolatile memristor 10, and to input the information stored in the nonvolatile memristor 10 into an artificial neural network 200. In other words, information read after being stored in the nonvolatile memristor 10 may be input to the artificial neural network 200. For example, the information stored in the nonvolatile memristor 10 may be input to the artificial neural network 200 as a form of MCV (memristor conductance vector), and the kind of information initially input to the temporal kernel device 100 may be identified through information (data) processing/recognition of the artificial neural network 200.

A temporal kernel computing system according to an embodiment of the present invention may include the above-described temporal kernel device 100, and the artificial neural network 200 connected to the above-described temporal kernel device 100 and receiving information processed by the temporal kernel device 100. The specific configuration and principle of the artificial neural network 200 may be the same as or similar to those well-known in the conventional art.

Figure 2:
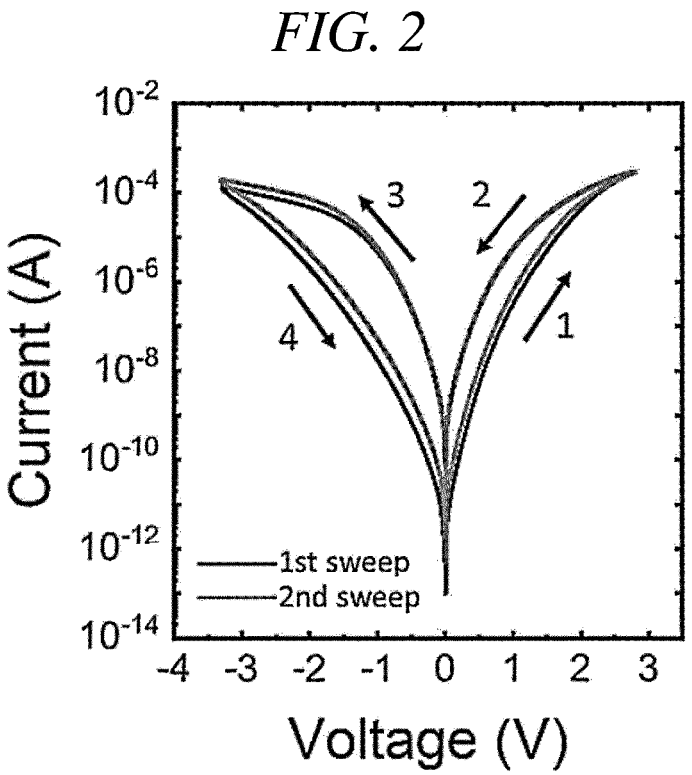
FIG. 2 is a graph illustrating a voltage-current characteristic of a nonvolatile memristor that may be applied to a temporal kernel device according to an embodiment of the present invention.

FIG. 2 is a graph illustrating a voltage-current characteristic of a nonvolatile memristor that may be applied to a temporal kernel device according to an embodiment of the present invention. Here, the nonvolatile memristor has a W/HfO$_2$/TiN structure.

Referring to FIG. 2, the nonvolatile memristor applicable to a temporal kernel device according to an embodiment of the present invention may exhibit a voltage-current characteristic as illustrated in accordance with a voltage sweep. When the voltage is swept in the positive (+) direction, a SET switching may occur as the current increases due to the increase in conductivity (conductance) (i.e., change from curve 1 to curve 2). On the other hand, when the voltage is swept in the negative (−) direction, a RESET switching in which the current decreases due to a decrease in conductivity (conductance) may occur (i.e., change from curve 3 to curve 4). However, the characteristic of the nonvolatile memristor shown in FIG. 2 is described as an example and may be variously changed.

Figure 3:
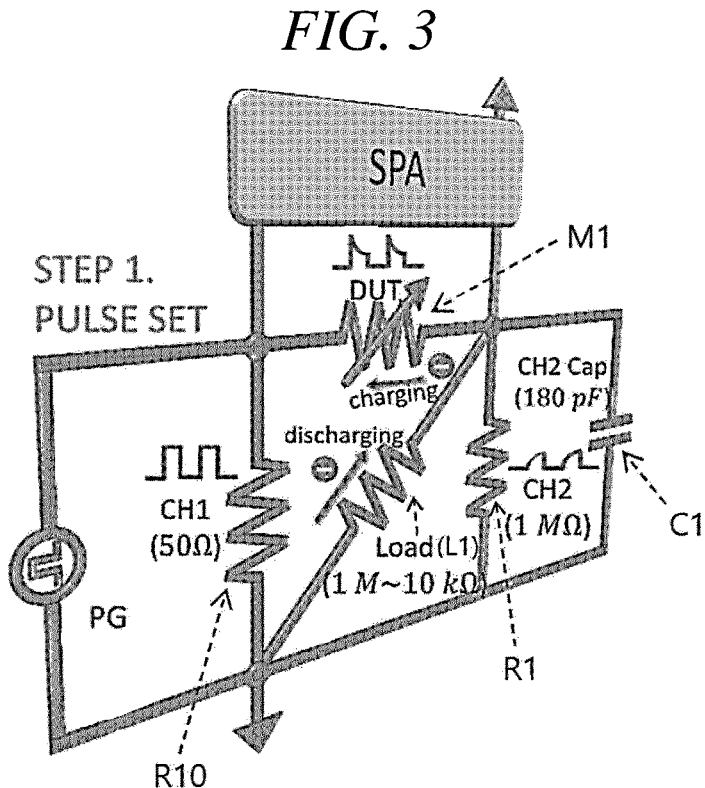
FIG. 3 is a circuit diagram illustrating a measurement circuit to which a circuit configuration corresponding to a cell structure of a temporal kernel device according to an embodiment of the present invention is applied.

FIG. 3 is a circuit diagram illustrating a measurement circuit to which a circuit configuration corresponding to a cell structure of a temporal kernel device according to an embodiment of the present invention is applied.

Referring to FIG. 3, a resistor R1 may be connected in series to a nonvolatile memristor M1, and a capacitor C1 may be connected in series to the nonvolatile memristor M1, and the resistor R1 and the capacitor C1 may be arranged in parallel with each other. The nonvolatile memristor M1, the resistor R1, and the capacitor C1 may correspond to the nonvolatile memristor 10, the resistor 20, and the capacitor 30 of FIG. 1, respectively. Here, the resistance of the resistor R1 may be 1 MΩ, and the capacitance of the capacitor 30 may be 180 pF. Meanwhile, a load resistor L1 connected in parallel to the resistor R1 with respect to the nonvolatile memristor M1 may be a resistor (an auxiliary resistor) for changing a resistance value in a measurement situation. The resistance of the load resistor L1 may be changed between 1 MΩ and 10 KΩ.

An additional resistor R10 connected in series with the nonvolatile memristor M1 may be further disposed on the opposite side of the resistor R1. The additional resistor R10 may have, for example, a resistance of 50Ω. A pulse generator PG may be connected to the nonvolatile memristor M1 and the additional resistor R10. The pulse signal (a voltage pulse signal) generated by the pulse generator PG may be applied in the direction of a first channel CH1 in which the additional resistor R10 is disposed, and may also be applied to the direction of a second channel CH2 where the resistor 20 and the capacitor 30 are formed. Regardless of kinds of the signal (a pulse signal) applied to the first channel CH1, the original signal may be detected as it is. Meanwhile, the signal (a pulse signal) applied to the second channel CH2 may be affected by voltage distribution and RC delay, etc.

In the first step (STEP 1) corresponding to a pulse set, a predetermined pulse signal (a voltage pulse signal) may be applied from the pulse generator PG to the first channel CH1 and the second channel CH2. Predetermined information may be recorded (stored) in the nonvolatile memristor M1 by the pulse signal applied to the second channel CH2.

In FIG. 3, SPA represents a 'semiconductor parameter analyzer'. The SPA may be connected between both ends of the nonvolatile memristor M1. The SPA may not be activated in the first step (STEP 1), and may be used for reading in a step (i.e., STEP 2 in FIG. 4) for reading information written (stored) in the nonvolatile memristor M1. Meanwhile, in FIG. 3, the DUT means a 'device under test' and refers to the nonvolatile memristor M1.

Figures 4, 5:
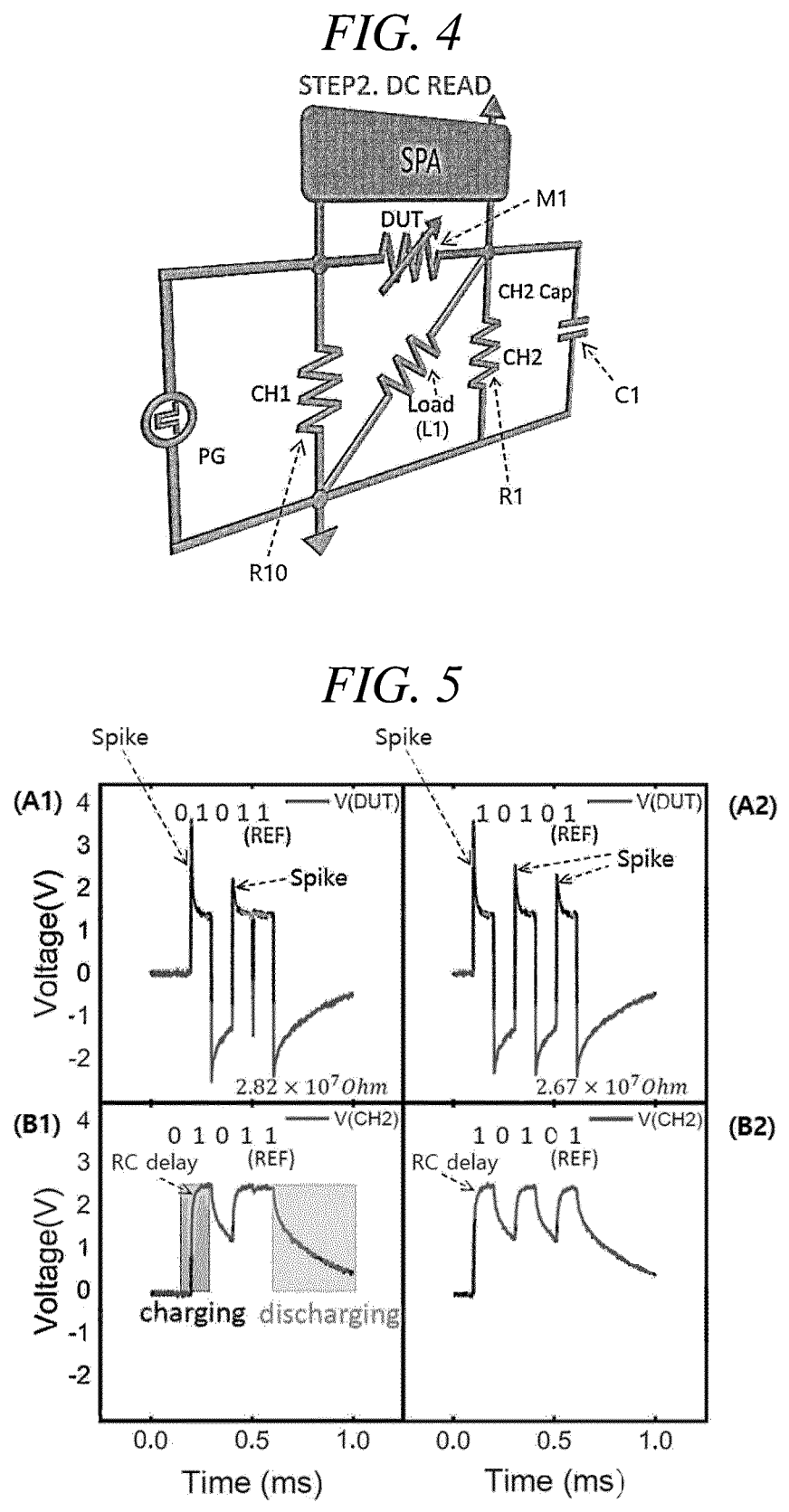

FIG. 4 is a circuit diagram showing a second step (STEP 2) for reading information recorded (stored) in the nonvolatile memristor M1 in the measurement circuit described in FIG. 3.

Referring to FIG. 4, the resistance state (that is, the conductance state) of the nonvolatile memristor M1 may be read through direct current (DC) voltage sweeping using the SPA connected to both ends of the nonvolatile memristor M1. This may correspond to a process for applying an electrical signal for reading information between the intermediate electrode E15 and the second electrode E20 in FIG. 1.

FIG. 5 is a data showing a form [graphs (A1) and (A2)] of a voltage applied to the nonvolatile memristor M1 and a form [graphs (B1) and (B2)] of voltage applied to the second channel CH2 by a predetermined pulse signal in the first step (STEP 1) of FIG. 3. Here, as the pulse signal, a signal corresponding to '01011' and a signal corresponding to '10101' were used. The last '1' in each pulse signal is a reference pulse. Signal '1' corresponds to a voltage of 4V, and signal '0' corresponds to a voltage of 0V.

Referring to the graph A1 of FIG. 5, a voltage of the illustrated form may be applied to the nonvolatile memristor M1 by a pulse signal corresponding to '01011'. When the signal corresponding to the first '1' is applied, it may be stabilized after the spike signal (first spike signal) occurs, and when the signal corresponding to the second '1' is applied, the spike signal (second spike signal) may occur once again and then be stabilized. After the application of the signal corresponding to the first '1', the signal corresponding to '0' is applied, and then the signal corresponding to the second '1' is applied. When the signal corresponding to '0' is applied, as a discharging phenomenon occurs to a certain degree, a spike signal may be generated when a signal corresponding to the second '1' is applied. However, the height of the second spike signal may be smaller than that of the first spike signal. When a signal corresponding to the first '1' is applied, since the cell may be in a completely discharged state, a full spike may occur, and when the signal corresponding to the second '1' is applied, as the cell has a state charged up to a certain degree, a spike which is lower than a full spike may occur.

When the signal corresponding to the third '1' is applied after the application of the signal corresponding to the second '1', the spike signal may not be generated. This may be because a discharging effect does not occur because there is no signal corresponding to '0' between them.

Referring to the graph B1 of FIG. 5, a voltage of the illustrated form may be applied to the second channel CH2 by a pulse signal corresponding to '01011'. When a signal corresponding to the first '1' is applied, charging occurs. At this time, RC delay may occur due to the influence of the resistor R1 and the capacitor C1. Due to this RC delay, the first spike signal described in the graph A1 may be generated. Also, when a signal corresponding to the first '1' is applied, voltage distribution may occur by the resistor R1 connected in series to the nonvolatile memristor M1. At this time, as the maximum magnitude of the voltage applied to the second channel CH2 is about 2.5V, and the maximum magnitude (maximum magnitude after stabilization) of the voltage applied to the nonvolatile memristor M1 is about 1.5V, their sum may be about 4V. This may correspond to a signal corresponding to '1' having a voltage of 4V. Accordingly, it may be confirmed that the voltage distribution effect has occurred.

When a signal corresponding to the second '0' is applied, discharging occurs to some extent, and when a signal corresponding to the second '1' is applied, charging may occur again together with an RC delay. The second spike signal in the graph A1 may be generated by the generated RC delay.

After the signal corresponding to the last '1' is applied, discharging may occur. Curves of charging and discharging in the second channel CH2 may exhibit asymmetric characteristics. In other words, the rates of charging and discharging may be significantly different from each other. Charging may be made relatively quickly, and discharging may be made relatively smoothly. It may be mentioned that this phenomenon is caused by an effect due to the use of the nonvolatile memristor M1. Since the nonvolatile memristor M1 has a rectifying characteristic that current flows well in one direction and current flows relatively less in the opposite direction, and a current-voltage non-linearity characteristic, the asymmetry of charging and discharging may appear due to the above characteristics of the nonvolatile memristor M1. Since the temporal kernel cell structure according to the embodiment of the present invention has an asymmetric characteristic of charging and discharging, in this regard, it is possible to obtain advantages that it is possible to implement more diverse dynamics and to secure various states.

Referring to the graph A2 of FIG. 5, a voltage of the illustrated form may be applied to the nonvolatile memristor M1 by a pulse signal corresponding to '10101'. In this pulse signal, '0' may always exist between '1' and '1'. In this case, the first spike signal (full spike signal) may be generated by the signal corresponding to the first '1', the second spike signal may be generated by the signal corresponding to the second '1', and the third spike signal may be generated by the signal corresponding to the third '1'.

Referring to the graph B2 of FIG. 5, a voltage of the illustrated form may be applied to the second channel CH2 by a pulse signal corresponding to '10101'. RC delay and a charging/discharging characteristic may appear by the pulse signal corresponding to '10101'.

According to an embodiment of the present invention, the resistance state (i.e., stored information) of the nonvolatile memristor M1 may vary according to the number of spike signals and the height of the spike signals. Both the '01011' signal and the '10101' signal have two '0' and three '1', but the number of spikes may vary depending on the order in which they are applied, and the height of the spike may also vary. As a result, the resistance state written to the nonvolatile memristor M1 may be changed. For example, as the number of spikes increases, the resistance value of the nonvolatile memristor M1 may decrease. In the case of the graph A1 of FIG. 5, the information (i.e., a resistance value) recorded in the nonvolatile memristor M1 was $2.82 \times 10^7$ ohm, and in the case of the graph A2 of FIG. 5, the information (i.e., a resistance value) recorded in the nonvolatile memristor M1 was $2.67 \times 10^7$ ohm. These resistance values are the results read by applying a DC voltage of 0.5V (i.e., a READ voltage) to the nonvolatile memristor M1. Accordingly, the information recorded in the nonvolatile memristor M1 may vary according to time-series input information. This may correspond to the separability required in the device for the kernel.

Figure 6:
FIG. 6 is a graph showing a result measuring how information stored in a nonvolatile memristor is changed by various input signals while changing a resistance value of a resistor of a temporal kernel device, and a pulse condition of an input signal according to an embodiment of the present invention.

FIG. 6 is a graph illustrating the results measuring how information (i.e., a resistance value) stored in a nonvolatile memristor is changed by various input signals while changing the resistance value of the resistor of the temporal kernel device and the pulse condition of the input signal according to an embodiment of the present invention. FIG. 6 is a measurement result obtained by using the measurement circuit described in FIG. 3.

The above-described input signal was a total of 16 signals from '0000' to '1111'. '0000' corresponds to 0 on the X axis, '0001' corresponds to 1 on the X axis, '0010' corresponds to 2 on the X axis, '0011' corresponds to 3, and '1111' corresponds to 15 on the X axis. This is as summarized in a table inside the graph (e) of FIG. 6. In addition, '1' was always applied as a reference signal after the input signal. Accordingly, a total of 16 signals from '00001' to '11111' were actually applied. The reference signal may be said to be commonly applied after all input signals to confirm the final discharging state.

In the case of the graph (a) of FIG. 6, the resistance value (RL) of the load resistor (L1 in FIG. 3) was 1 MΩ, and a height and a width of the signal pulse (a signal pulse corresponding to '1') were 4V and 100 μs, respectively. A height and a width of the reference pulse were 4V and 100 μs, respectively. A width of the signal pulse corresponding to '0' was 100 μs.

In the case of the graph (b) of FIG. 6, the resistance value (RL) of the load resistor (L1 in FIG. 3) was 120 MΩ, and a height and a width of the signal pulse (a signal pulse corresponding to '1') were 4V and 100 μs, respectively. A height and a width of the reference pulse were 4V and 100 μs, respectively. A width of the signal pulse corresponding to '0' was 100 μs.

In the case of the graph (c) of FIG. 6, the resistance value (R$_L$) of the load resistor (L1 in FIG. 3) was 1 MΩ, and a height and a width of the signal pulse (a signal pulse corresponding to '1') were 4V and 200 μs, respectively. A height and a width of the reference pulse were 4V and 200 μs, respectively. A width of the signal pulse corresponding to '0' was 200 μs.

In the case of the graph (d) of FIG. 6, the resistance value (R$_L$) of the load resistor (L1 in FIG. 3) was 1 MΩ, and a height and a width of the signal pulse (a signal pulse corresponding to '1') were 3.5V and 100 μs, respectively. A height and a width of the reference pulse were 3.5V and 100 μs, respectively. A width of the signal pulse corresponding to '0' was 100 μs.

In the case of the graph (e) of FIG. 6, the resistance value (RL) of the load resistor (L1 in FIG. 3) was 1 MΩ, and a height and a width of the signal pulse (a signal pulse corresponding to '1') were 4V and 100 μs, respectively. A height and a width of the reference pulse were 3V and 100 μs, respectively. A width of the signal pulse corresponding to '0' was 100 μs.

In the case of the graph (f) of FIG. 6, the resistance value (RL) of the load resistor (L1 in FIG. 3) was 10 kΩ, and a height and a width of the signal pulse (a signal pulse corresponding to '1') were 3.5V and 200 ns, respectively. A height and a width of the reference pulse were 3V and 200 ns, respectively. A width of the signal pulse corresponding to '0' was 200 ns.

The temporal kernel conditions applied to (a) to (f) of FIG. 6 are summarized in Table 1 as below. In Table 1, the values of the signal pulse indicate a height and a width of a signal pulse corresponding to '1', and the values of the REF pulse indicate a height and a width of a reference pulse.

TABLE 1

| TK Condition | R$_L$ | Signal Pulse | REF Pulse |
| --- | --- | --- | --- |
| (a) in FIG. 6 | 1 MΩ | 4 V, 100 μs | 4 V, 100 μs |
| (b) in FIG. 6 | 120 kΩ | 4 V, 100 μs | 4 V, 100 μs |
| (c) in FIG. 6 | 1 MΩ | 4 V, 200 μs | 4 V, 200 μs |
| (d) in FIG. 6 | 1 MΩ | 3.5 V, 100 μs | 3.5 V, 100 μs |
| (e) in FIG. 6 | 1 MΩ | 4 V, 100 μs | 3 V, 100 μs |
| (f) in FIG. 6 | 10 kΩ | 3.5 V, 200 ns | 3 V, 200 ns |

Referring to the graph (a) of FIG. 6, the input signals of the data group G1 disposed at the bottom correspond to '0000+Ref', '0001+Ref', '0011+Ref', '0111+Ref', '1111+Ref' when observed from a left direction to a right direction. In other words, the input signals of the data group G1 disposed at the bottom correspond to '00001', '00011', '00111', '01111', and '11111' when observed from a left direction to a right direction. These signals are signals to which a high signal (i.e., '1') is continuously applied and a spike occurs only once. Accordingly, a conductance state (i.e., read current) of the group G1 may be located at the bottom of the graph and may have almost similar (constant) levels to each other.

On the other hand, the case that the conductance (i.e., read current) is the highest corresponds to the case that the input signal is '1000+Ref' (No. 8 on the X-axis). That is, when the input signal was '10001', the highest read current was measured. This input signal is a case in which a full spike occurs at the beginning, a discharging phenomenon almost completely occurs while resting for a long time, and a full spike occurs again at the end. Two full spikes occur with the longest pause between the two spikes. In this case, the highest read current may occur.

The graph (b) of FIG. 6 is a case in which $R_L$ (a resistance value of the load resistor) of 120 kΩ is used. In this case, the case where a conductance (i.e., read current) is the highest corresponds to the case where the input signal is '1010+Ref' (No. 10 on the X-axis). That is, when the input signal was '10101', the highest read current was measured. When an $R_L$ of 120 kΩ is used, a long idle time may not be required as shown in the graph (a). That is, when an $R_L$ of 120 kΩ is used, discharging may be sufficiently performed even for one low signal (i.e., '0'). Accordingly, a full spike (or almost full spike) may occur three times by the signal of '10101'.

Meanwhile, the inputs signal of the data group G1' arranged at the bottom of the graph (b) correspond to '0000+Ref', '0001+Ref', '0011+Ref', '0111+Ref', and '1111+Ref' which are arranged at the bottom. In other words, the input signals of the data group G1' disposed at the bottom correspond to '00001', '00011', '00111', '01111', and '11111' when observed from a left direction to a right direction. These signals correspond to input signals of the data group G1 disposed at the bottom of the graph (a). In the graph (b), the read current tends to gradually increase as the group (i.e., G1') in which the spike occurs only once goes to the right direction. This may be due to the voltage distribution characteristic. In a case of the graph (b), since the resistance value used is small, a small voltage may be applied to the resistor and a large amount may be applied to the nonvolatile memristor. Accordingly, a certain amount of SET switching may occur in the nonvolatile memristor due to only the distributed voltage. As a result, the change trend of the G1' group may be different from that of the G1 group in the graph (a).

The graph (c) in FIG. 6 is a case in which the resistance value is the same as that of (a) in FIG. 6, but a width (a length) and an interval of a pulse are increased to 200 μs. In this case, it was confirmed that the result significantly different from the graph (a) appears. That is, in the graph (c), it was confirmed that three groups (G11, G12, G13) identified only by the number of spike are appeared. The G11 group is a group in which a spike occurs only once, the G12 group is a group in which the spike occurs twice, and the G13 group is a group in which the spike occurs three times. A device in which the level of the read current is determined only by the number of spikes may be configured. In addition, various modifications such as (d), (e), (f) of FIG. 6 may be possible.

According to an embodiment of the present invention, a temporal kernel cell structure composed of 1M1R1C is employed, various operation characteristics and dynamics may be implemented by changing the resistance value of the resistor, the capacitance of the capacitor, and the condition of the pulse signal, and the like. Furthermore, it is possible to increase a bandwidth (a frequency band) of a signal ranging from a very fast signal to a very slow signal which may be processed by adjusting the RC delay value. In addition, it may be possible to optimize the temporal kernel element according to the intended use and purpose.

Recognition of an image of a Modified National Institute of Standards and Technology (MNIST) database was performed by using a temporal kernel device according to an embodiment of the present invention. MNIST recognition may be an objective indicator for evaluating temporal kernel elements. The image used for MNIST recognition is a numerical image corresponding to 0 to 9, and is a data set for learning and recognizing 60,000 images.

The temporal kernel condition corresponding to (f) of FIG. 6 was used for the MNIST recognition. A process for learning and recognizing the MNIST image was performed by using the temporal kernel condition corresponding to (f) of FIG. 6. The values indicated by red circles in the graph (f) of FIG. 6 correspond to signals most frequently appearing in MNIST. In this way, after separating the signals frequently appearing in MNIST, a learning process was carried out.

Table 2 below summarizes the results of MNIST recognition based on the embodiment of the present invention, the conventional technology (1), the conventional technology (2), and software. In Table 2, 'Latency in the kernel' may correspond to the processing speed of the kernel. The software-based system is a case using a readout layer of a single-layer Forward Neutron Calorimeter (single-layer FNC). Both of the conventional techniques (1) and (2) use a hardware kernel device. In the case of the conventional techniques (1) and (2), a process for cropping and processing the image advantageously is further included, but this additional process is not included in the embodiment of the present invention.

TABLE 2

| Group | Accuracy | Latency in the kernel | Kernel adaptation | Network size | Image size |
|---|---|---|---|---|---|
| Embodiments | 90% (95.1% - two layer) | 1 μs | ○ | 196 × 10 (196 × 38 × 10) | 28 × 28 |
| Conventional Technology (1) | 85% | 10 ms | X | 88 × 10 | 22 × 20 |
| Conventional Technology (2) | 83% | 1 ms | X | 220 × 10 | 22 × 20 |
| Software (784 × 10 FCN) | 91% | — | — | 784 × 10 | 28 × 28 |

Referring to Table 2, it may be confirmed that the MNIST recognition according to the embodiment of the present invention exhibits excellent characteristics such as high accuracy of about 90% and a fast processing speed of about 1 μs. The accuracy was almost the same as that of the software-based system, and the processing speed (a time required to process one image) was 1000 to 10000 times faster than the conventional technology (existing technology). It is possible to adjust the processing speed by adjusting the RC delay in the embodiment of the present invention.

Table 3 below summarizes the evaluation results of how the readout layer size and recognition accuracy change while increasing the number (that is, nBPK) of bits processed in the temporal kernel in MNIST recognition according to an embodiment of the present invention.

TABLE 3

| nBPK | Readout Layer Size | Accuracy |
|------|--------------------|----------|
| 3 | 252 × 10 | 90.7% |
| 4 | 196 × 10 | 90.1% |
| 5 | 140 × 10 | 88.1% |
| 6 | 112 × 10 | 86.3% |

Referring to Table 3, even if nBPK is increased, a tremendously high accuracy may be secured, and the read layer size may be greatly reduced.

The operation method of the temporal kernel device according to an embodiment of the present invention is summarized as follows. According to an embodiment of the present invention, an operation method of the temporal kernel device is the operation method of the temporal kernel device including at least one temporal kernel cell structure, and wherein the temporal kernel cell structure includes a nonvolatile memristor, a resistor connected in series with the nonvolatile memristor, and a capacitor connected in series with the nonvolatile memristor, wherein the resistor and the capacitor are connected in parallel with the nonvolatile memristor. The method of operating the temporal kernel device may include applying a time-series input signal to the kernel cell structure to store information in the nonvolatile memristor and reading the information stored in the nonvolatile memristor.

Here, the temporal kernel device may be same as the device described with reference to FIG. 1. Accordingly, the temporal kernel device may include a first electrode, an intermediate electrode, and a second electrode. The resistor and the capacitor may be disposed to be spaced apart from each other between the first electrode and the intermediate electrode, and the nonvolatile memristor may be disposed between the intermediate electrode and the second electrode.

The storing the information in the nonvolatile memristor may include applying an electrical signal corresponding to the time-series input signal to the second electrode while the first electrode is grounded. The reading the information stored in the nonvolatile memristor may include applying an electrical signal for reading the information between the intermediate electrode and the second electrode. Furthermore, the method of operating the temporal kernel device may further include changing at least one of a resistance value of the resistor and a capacitance of the capacitor.

In addition, the method of operating the temporal kernel device may be understood based on the configuration and operating characteristics of the temporal kernel device described with reference to FIGS. 1 to 6. Furthermore, the operation method of the temporal kernel computing system to which the temporal kernel device according to the embodiment is applied may be easily understood.

A temporal kernel device according to an embodiment of the present invention and a temporal kernel computing system including the same may be used when it is suitable to receive a time-series signal. In this regard, it may be suitable for the temporal kernel device and the temporal kernel computing system to be applied to a medical diagnosis field or the like. For example, in the case of heart rate, a slow signal of about 1 Hz is used, and in the case of ultrasound, a fast signal of about 10 MHz is used. The temporal kernel device according to an embodiment of the present invention may increase the bandwidth of a processable signal by changing RC delay value by changing at least one of a resistance value of a resistor and a capacitance of a capacitor. Accordingly, it is possible to implement a temporal kernel device having operational characteristics and dynamics optimized for use. In addition, when the temporal kernel computing system according to an embodiment of the present invention is used, the temporal kernel computing system may make a medical diagnosis (judgment) without visualization of data or judgments made by a person (examiner/doctor).

Figure 7:
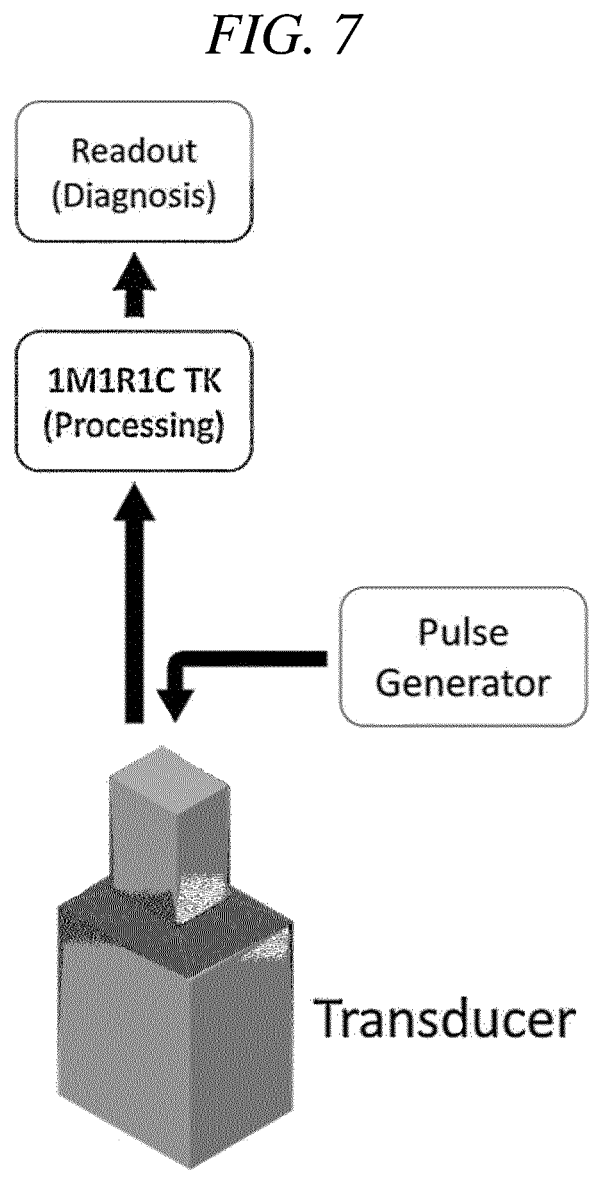

FIG. 7 is a conceptual diagram illustrating a process for making a medical diagnosis on ultrasound data by using a temporal kernel computing system according to an embodiment of the present invention.

Referring to FIG. 7, when ultrasound data is transmitted from a transducer to a temporal kernel computing system, the ultrasound data is directly processed in a temporal kernel device without a need to visualize the ultrasound data, and an artificial neural network may make a diagnosis on the ultrasound data. Ultrasound diagnosis was performed on 100 samples (tumor samples), and the temporal kernel computing system according to an embodiment of the present invention showed an accuracy of 94.6% in determining whether a tumor was negative or positive.

Figure 8:
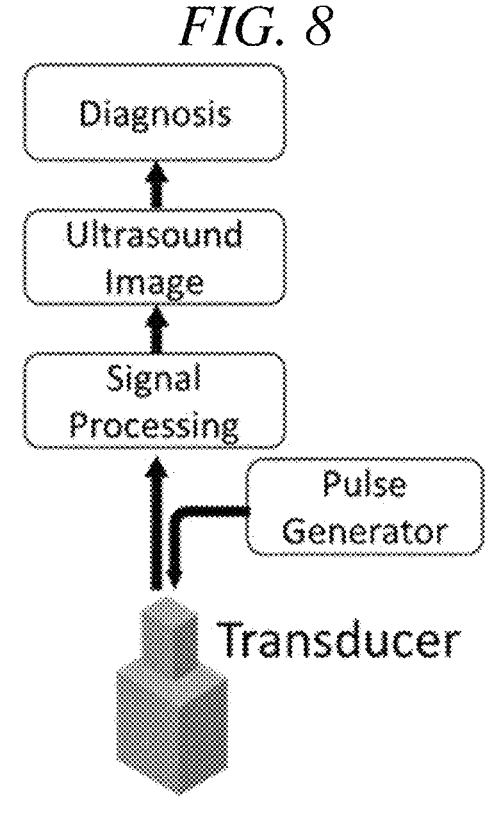
FIG. 8 is a conceptual diagram illustrating a diagnosis process based on an ultrasound analysis method according to a comparative example.

FIG. 8 is a conceptual diagram illustrating a diagnosis process according to an ultrasound analysis method according to a comparative example. The ultrasound analysis method according to the comparative example may be a conventional ultrasound analysis method.

Referring to FIG. 8, in the ultrasound analysis method according to the comparative example, a process in which ultrasound data is visualized is required, and an examiner such as a doctor determines the visualized result to make a diagnosis. Compared to such an analysis method, the method according to the embodiment of the present invention described with reference to FIG. 7 may be simple and exhibit high accuracy.

Figure 9:
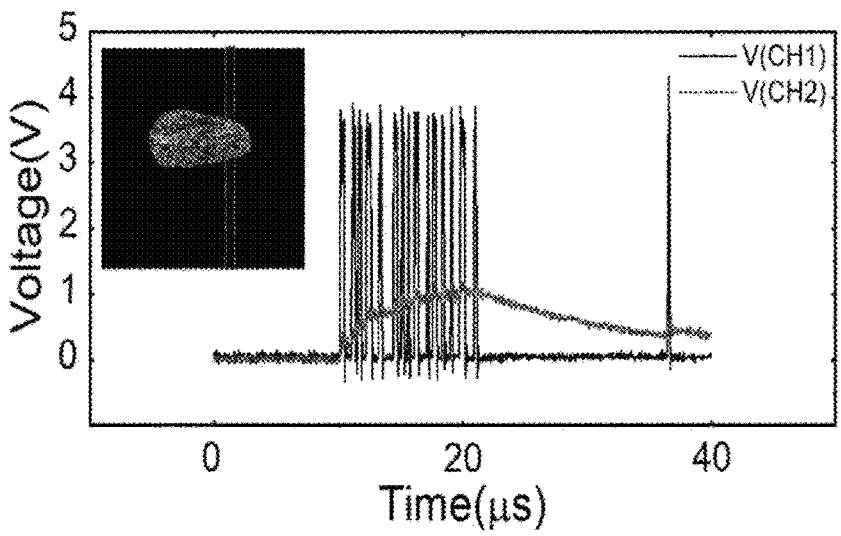
FIG. 9 is a graph showing a form of a voltage applied to a resistor in ultrasound analysis using a temporal kernel computing system according to an embodiment of the present invention.

FIG. 9 is a graph illustrating a form of a voltage applied to a resistor in ultrasound analysis using a temporal kernel computing system according to an embodiment of the present invention.

Referring to FIG. 9, when an ultrasonic signal corresponding to 10 MHz is applied to the 1M1R1C temporal kernel device, it shows how the voltage applied to the resistor is changed in real time. The graph of CH1 corresponds to the original type of the input signal, and the graph of CH2 indicates the voltage applied to the resistor. It may be confirmed that the voltage applied to the resistor is changed according to the change of the ultrasound signal at the region where the tumor is located. It may be seen that it is possible to implement a temporal kernel device capable of appropriately responding to an input signal having a high speed.

Figure 10:
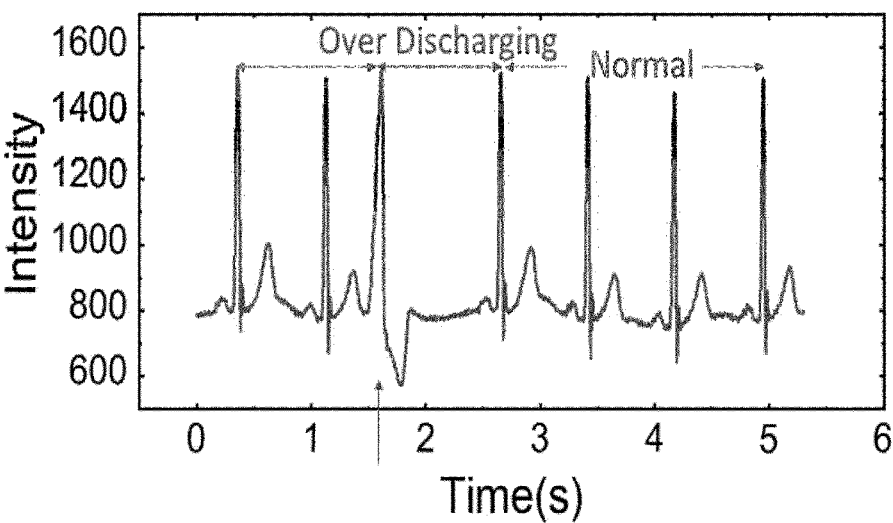
FIG. 10 is a graph showing an electrocardiogram when arrhythmia occurs.

FIG. 10 is a graph illustrating an electrocardiogram displayed when arrhythmia occurs.

Referring to FIG. 10, when there is an arrhythmia, an irregular heartbeat region may appear. That is, there may be a region in which the heart beats twice faster than in the normal case and has a relatively long rest period. This irregular heartbeat region may appear, for example, about once per second. Therefore, it is necessary to configure a temporal kernel device suitable for a slow signal for such electrocardiogram data. For example, a temporal kernel device having an increased RC delay may be configured by increasing the resistance value of the resistor and/or increasing the capacitance of the capacitor.

In addition, in the analysis (diagnosis) of electrocardiogram data, the 'paralysis' phenomenon of the temporal kernel device according to the embodiment of the present invention may be used. Here, the 'paralysis' phenomenon may mean a phenomenon in which there is no response even when stimulating (continuous) signals are applied, as in the data group G1 which exists at the bottom of the graph (a) of FIG. 6.

In the normal range of electrocardiogram (ECG) data without arrhythmias, since signals are regularly generated at regular intervals, a 'paralyzed' temporal kernel device may be implemented for stimulation of such regular signals. However, in the electrocardiogram data with arrhythmia, there is a region with an excessively long interval between signals, that is, an over-discharging region (see FIG. 10). Therefore, when the next signal is applied after over-discharging by the over-discharging region, the resistance change of the memristor due to the spike may occur. Arrhythmia may be diagnosed by using this when paralysis occurs in the normal range and signal change due to a change in the resistance of the memristor occurs in the abnormal case (i.e., when there is an arrhythmia). In addition, the degree of arrhythmia may be confirmed through the degree of signal change.

Figure 11:
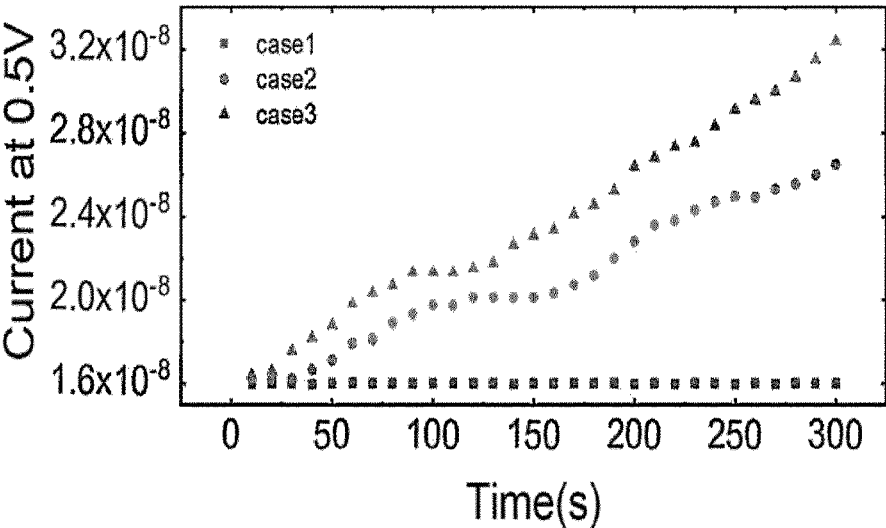
FIG. 11 is a graph showing a result of monitoring an arrhythmia using a temporal kernel computing system according to an embodiment of the present invention.

FIG. 11 is a graph showing a result of monitoring an arrhythmia using a temporal kernel computing system according to an embodiment of the present invention. Arrhythmias were diagnosed in three cases (case 1, 2, 3).

Referring to FIG. 11, it shows the arrhythmia monitoring results using the 1M1R1C temporal kernel device for three cases (cases 1, 2, and 3). Case 1 is a normal case and there is no increase in the conductance of the nonvolatile memristor. In cases 2 and 3, arrhythmias occurred 49 times and 81 times, respectively, for 5 minutes. Thus, it was confirmed that the conductance of the nonvolatile memristor was increased in cases 2 and 3. As a result, the degree of arrhythmia may be diagnosed through the degree of change in the conductance of the nonvolatile memristor.

According to the embodiments of the present invention described above, unlike the existing volatile memristor-based reservoir device which may implement only a single characteristic, the time constant may be freely adjusted and various characteristics (kernel characteristics) may be implemented. Thus, it is possible to implement a temporal kernel device that may be applied to a wide field and may be optimized according to the task to be performed. In addition, according to embodiments of the present invention, it is possible to improve accuracy, efficiency, and a processing speed of signal processing, and to implement a temporal kernel device capable of processing a signal in a wide frequency range.

The temporal kernel device according to the embodiments has various effects/benefits due to the spike signal generation in the nonvolatile memristor, the voltage distribution characteristic between the nonvolatile memristor and the resistor, and the asymmetric characteristic of charging/discharging, and the like. In this regard, the temporal kernel device according to the embodiments may perform signal processing at a speed of about 1000 to 10000 times faster and with an energy efficiency of about 100 times or more compared to existing technologies. In addition, the temporal kernel device according to the embodiments may process a signal corresponding to a wide frequency range ranging from, for example, about 1 Hz to 10 MHz by adjusting a resistance value of a resistor and/or a capacitance of a capacitor. In addition, the temporal kernel device according to the embodiments may have high signal processing accuracy.

It is possible to implement a temporal kernel computing system having excellent performance and applicable to various fields if the temporal kernel device according to the above embodiment is applied.

In addition, in an embodiment of the present invention, phenomena such as paralysis and hypersensitivity may be realized or simulated through control of the circuit components. For example, 'paralysis' may be implemented by setting the memristor conductance to increase only for voltage spikes and not to operate in response to the divided voltage. On the other hand, if the capacitor is not fully charged with one pulse and the resistance of the resistor is set low, it may make the device react strongly (hypersensitivity) even to continuous stimulation. In addition, the device and the system according to the embodiment of the present invention may be utilized in various ways.

In the present specification, the preferred embodiments of the present invention have been disclosed, and although specific terms are used, these are only used in a general sense to easily explain the technological content of the present invention and to help the understanding of the present invention, but they are not used to limit the scope of the present invention. It is apparent to those having common knowledge skill in the art to which the present invention pertains that other modifications based on the technological spirit of the present invention may be implemented in addition to the embodiments disclosed herein. Those having common knowledge in the related art will understand that in connection with a temporal kernel device, a temporal kernel computing system including the same, and an operating method thereof according to the embodiments which are described with reference to FIGS. 1 to 11, various substitutions, changes, and modifications may be made without departing from the scope of the technological spirit of the present invention. Therefore, the scope of the invention should not be determined by the described embodiments, but should be determined by the technological concepts described in the claims.

The invention claimed is:

1. A temporal kernel device comprising:
   at least one temporal kernel cell structure,
   wherein each of the temporal kernel cell structure comprises:
      a first electrode;
      an intermediate electrode physically distinct from and spaced apart from the first electrode; and
      a second electrode physically distinct from and spaced apart from the intermediate electrode;
   a resistor and a capacitor connected in parallel to each other, the resistor and the capacitor being physically disposed between the first electrode and the intermediate electrode as distinct conductive elements formed on a same side of the intermediate electrode; and a nonvolatile memristor connected in series with the resistor and the capacitor, the nonvolatile memristor being physically disposed on an opposite side of the intermediate electrode between the intermediate electrode and the second electrode, wherein the resistor and the capacitor connected in parallel are connected in series to the nonvolatile memristor.

2. The temporal kernel device of claim 1, wherein a plurality of the temporal kernel cell structures is arranged to form an array, wherein the temporal kernel device comprises at least one first electrode extending in a first direction, a plurality of second electrodes spaced apart from the first electrode and extending in a second direction crossing the first electrode, and a plurality of intermediate electrodes each of which is disposed between the first electrode and the plurality of second electrodes at an intersection of the first electrode and the plurality of second electrodes, wherein the plurality of temporal kernel cell structures is disposed at the intersections of the first electrode and the plurality of second electrodes, respectively, wherein each of the temporal kernel cell structures includes the resistor and the capacitor which are disposed to be spaced apart from each other between the first electrode and the intermediate electrode, and the nonvolatile memristor disposed between the intermediate electrode and the second electrode.

3. The temporal kernel device of claim 2, wherein the at least one first electrode is a ground electrode, and an electrical signal is applied to the plurality of second electrodes.

4. The temporal kernel device of claim 1, wherein the temporal kernel device is configured to vary at least one of a resistance value of the resistor and a capacitance of the capacitor.

5. The temporal kernel device of claim 1, wherein the resistor is a variable resistance resistor capable of changing a resistance value.

6. The temporal kernel device of claim 1, wherein the capacitor is a variable capacitance capacitor capable of changing capacitance.

7. The temporal kernel device of claim 1, wherein the temporal kernel device is configured to process a signal corresponding to a frequency region ranging from 1 Hz to 10 MHz.

8. The temporal kernel device of the claim 1, wherein the temporal kernel device is configured to store information in the nonvolatile memristor and to input the information stored in the nonvolatile memristor to an artificial neural network.

9. A temporal kernel computing system comprising:
a temporal kernel device of claim 1; and
an artificial neural network connected to the temporal kernel device and receiving information processed by the temporal kernel device.

10. A method of operating a temporal kernel device including at least one temporal kernel cell structure, wherein each temporal kernel cell structure includes:
a first electrode;
an intermediate electrode physically distinct from and spaced apart from the first electrode; and
a second electrode physically distinct from and spaced apart from the intermediate electrode;
a resistor and a capacitor connected in parallel to each other, the resistor and the capacitor being physically disposed between the first electrode and the intermediate electrode as distinct conductive elements formed on a same side of the intermediate electrode; and
a nonvolatile memristor connected in series with the resistor and the capacitor, the nonvolatile memristor being physically disposed on an opposite side of the intermediate electrode between the intermediate electrode and the second electrode, the intermediate electrode physically separating the resistor and the capacitor from the nonvolatile memristor in a stacked structure, the method comprising:
applying a time-series input signal between the first electrode and the second electrode such that the time-series input signal propagates through the resistor and the capacitor disposed between the first electrode and the intermediate electrode and then through the nonvolatile memristor disposed between the intermediate electrode and the second electrode;
storing information in the nonvolatile memristor based on the time-series input signal; and
reading the information stored in the nonvolatile memristor.

11. The method of operating a temporal kernel device of claim 10, wherein the storing the information in the nonvolatile memristor includes applying an electrical signal corresponding to the time-series input signal to the second electrode while the first electrode is grounded.

12. The method of operating a temporal kernel device of claim 11, wherein the reading the information stored in the nonvolatile memristor includes applying an electrical signal for reading the information between the intermediate electrode and the second electrode.

13. The method of operating a temporal kernel device of claim 10, further comprising changing at least one of a resistance value of the resistor and a capacitance of the capacitor.

* * * * *